United States Patent [19]

Posseme et al.

[11] Patent Number: 4,731,582
[45] Date of Patent: Mar. 15, 1988

[54] METHOD AND APPARATUS FOR CORRECTING ALIGNMENT ERRORS IN A MAGNETOMETER SYSTEM

[75] Inventors: Gilles Posseme; Germain Guillemin, both of Brest, France

[73] Assignee: Thomson CSF, Paris, France

[21] Appl. No.: 691,138

[22] Filed: Jan. 14, 1985

[30] Foreign Application Priority Data

Jan. 24, 1984 [FR] France ................. 84 01051

[51] Int. Cl.⁴ ................. G01R 33/022; G01R 33/025
[52] U.S. Cl. ..................................... 324/245; 324/246; 324/247
[58] Field of Search ................ 324/244–247, 324/253–260, 202, 326, 330, 331, 262

[56] References Cited

U.S. PATENT DOCUMENTS

| | | | |
|---|---|---|---|
| 3,281,660 | 10/1966 | Studenick | 324/326 |
| 3,397,586 | 8/1968 | Crook | 324/247 X |
| 3,488,579 | 1/1970 | Schonstedt | 324/245 |
| 3,728,525 | 4/1973 | Adkar | 324/247 X |
| 3,744,312 | 7/1973 | Anderson | 324/247 X |
| 3,757,209 | 9/1973 | Schonstedt | 324/245 |
| 4,109,199 | 8/1978 | Ball et al. | 324/202 |
| 4,134,061 | 1/1979 | Gudgel | 324/326 X |
| 4,309,659 | 1/1982 | Yoshii | 324/326 X |
| 4,384,253 | 5/1983 | Forster | 324/245 X |
| 4,386,318 | 5/1983 | Burbank et al. | 324/244 |
| 4,390,836 | 6/1983 | Bruce et al. | 324/326 X |
| 4,539,522 | 9/1985 | Schonstedt | 324/245 |
| 4,639,674 | 1/1987 | Rippingale | 324/67 X |

FOREIGN PATENT DOCUMENTS 1523462 3/1967 France ................. 324/245

Primary Examiner—Reinhard J. Eisenzopf
Assistant Examiner—Warren S. Edmonds
Attorney, Agent, or Firm—Cushman, Darby & Cushman

[57] ABSTRACT

A process for automatically correcting alignment errors between the measuring magnetometers of a magnetic gradient meter, consists in adding to such a gradient meter two additional magnetometers perpendicular to each other and to the axis of the measuring magnetometers. The measurements delivered by these additional magnetometers allow, with two coefficients obtained by previous calibration, the two main errors terms to be calculated and the measured value of the gradient to be corrected accordingly, which allows the alignment error to be corrected electronically and automatically.

2 Claims, 3 Drawing Figures

METHOD AND APPARATUS FOR CORRECTING ALIGNMENT ERRORS IN A MAGNETOMETER SYSTEM

BACKGROUND OF THE INVENTION

The present invention relates to processes for automatically compensating the mechanical errors in devices used for measuring the gradient of a magnetic field, known under the name of magnetic gradient meters. It also relates to devices for implementing this process and the gradient meters which are equipped thereby.

It is known to measure the gradient of the component of a magnetic field in a given direction along an axis Y at a point on this axis by placing two directional measuring probes, or magnetometers, on the axis, on each side of this point, and separated by a small distance $\delta Y$. If $\delta Hy$ is the difference in the measurements of the two probes, the value of the gradient to be measured is given by;

$$\frac{\delta Hy}{\delta y}$$

In addition to the causes of errors due to the defects of the probes themselves taken individually and to the associated electronic equipment, an important source of error is the lack of colinearity of the measuring axes of the two probes.

The inventor of the present invention, in his French patent application No. 83,1571 filed on the Oct. 4, 1983, has proposed constructing an integrated magnetic gradient meter in which the measuring axis is defined by a single light beam which passes through a thin layer in its thickness, which intrinsically eliminates alignment errors.

Such a device is however, not adapted to all the measuring configurations, particularly when the distance $\delta y$ is not very small. Furthermore, it is often desired, for reasons of cost, to be able to associate currently available magnetometers together so as to form a gradient meter.

SUMMARY OF THE INVENTION

So as to be able to correct the alignment error of such a gradient meter automatically and electronically, the invention proposes adding thereto two additional magnetometers perpendicular to the measuring axis of the gradient and perpendicular to each other. Using coefficients obtained by previous testing, the measurements obtained by these magnetometers give two main error terms to be subtracted from the measurement of the gradient.

BRIEF DESCRIPTION OF THE DRAWINGS

Other features and advantages of the invention will be clear from the following description, with reference to the accompanying Figures which show.

DESCRIPTION OF THE PREFERRED EMBODIMENT

Figure 1:
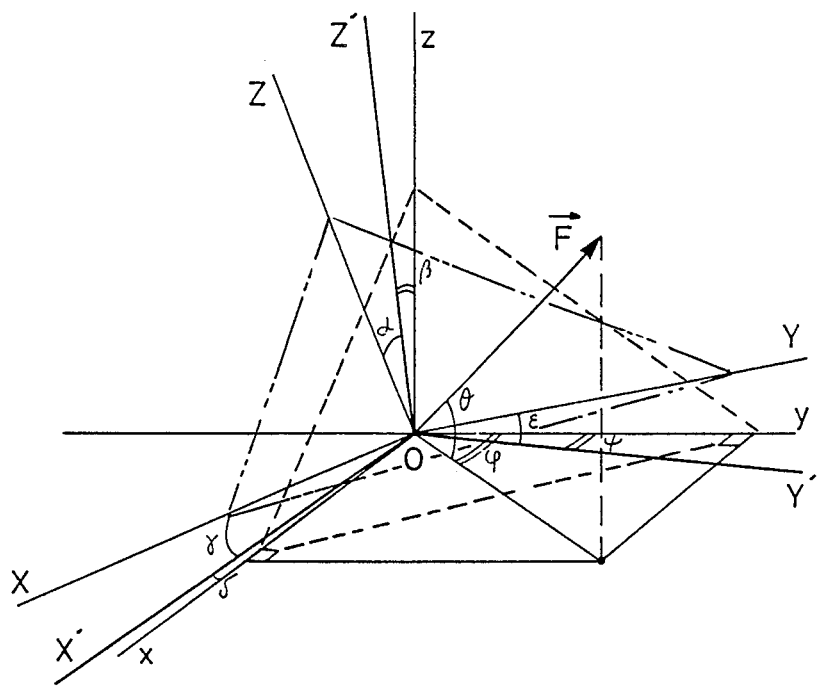
FIG. 1, a system of axes defining a gradient meter.

So as to be able to estimate the error due to the lack of colinearity, a trirectangular reference trihedron Oxyz has been shown in FIG. 1 in dashed lines, whose axis oy is that of one of the magnetometers of a gradient-meter.

A second trihedron OXYZ is defined by the axis OY of the second magnetometer of the gradient meter and by the axes OX and OZ of two other magnetometers, the purpose of which will be defined further on. The second trihedron is slightly different from the first one and is not trirectangular because of the inevitable errors in orientating the magnetometers defining it.

The projections X' and Y' of the axes X and Y on the plane oxy and Z' of axis Z on the plane yoz are defined by the angles $\gamma$, $\delta$, $\epsilon$, $\phi$, $\alpha$ and $\beta$ shown in FIG. 1.

The magnetic field whose gradient it is desired to measure is shown by a vector $\vec{F}$ whose orientation is defined by the angles $\theta$ and $\phi$ shown in this Figure.

With these definitions, the components of the field along the six axes thus defined are given by:

$$Hx = F \cos\theta \sin\phi$$

$$Hy = F \cos\theta \cos\phi$$

$$Hz = F \sin\theta$$

$$HX = F[\cos\theta \sin\phi \cos\delta \cos\gamma - \cos\theta \cos\phi \sin\delta \cos\gamma + \sin\theta \sin\gamma]$$

$$HY = F[\cos\theta \cos\phi \cos\epsilon + \cos\theta \sin\phi \sin\phi \cos\epsilon + \sin\theta \sin\epsilon]$$

$$HZ = F[\sin\theta \cos\beta \cos\alpha - \cos\theta \cos\phi \sin\beta \cos\alpha - \cos\theta \sin\phi \sin\alpha]$$

The gradient meter formed by the two magnetometers having axes oy and OY gives a measurement of the gradient of the field in a direction intermediate between these two axes. The error relating to the direction is not very important, but the error relating to the measurement itself remains to be estimated.

If the field is uniform, and so the gradient zero, the difference between the measurements from the two magnetometers should be zero. This is not the case because of the error of colinearity and a value is obtained given by:

$$\Delta = HY - HY = F[\cos\theta \cos\phi(\cos\phi \cos\epsilon - 1) + \cos\theta \sin\phi \sin\phi \cos\epsilon + \sin\theta \sin\epsilon]$$

This difference is a measure than of the error of colinearity along Oy and is formed from three terms which assume maximum values depending on the orientation of the gradientmeter.

In the earth's field (F = 50000 nT) and with (current) values of $\epsilon$ and $\phi$ equal to 0.2 degree, these maximum values are respectively:

0.6 nT for $\phi = \delta = 0$ 175 nT for $\theta = 0$ and $\phi = \pi/2$ 135 nT for $\theta = \pi/2$ and any $\phi$.

Now, the magnetometers, for example of the so called "flux-gate" type, used in gradientmeters have much lower sensitivities, typically less than 0.1 nT. It is then absolutely necessary to correct at least the last two terms of the error.

For that purpose, in accordance with the invention, calibration is carried out for determining the constant parameters of these two terms. This calibration then allows these terms to be calculated and to be deducted from the measurement so as to obtain a corrected measurement.

These constant parameters are those which depend on angles $\phi$ and $\epsilon$, ie $\sin \phi \cos \epsilon$ for the first term and $\sin \epsilon$ for the second term.

These parameters may be isolated for particular values of the angles $\theta$ and $\phi$. Then, for four orientations of the gradientmeter, the following values of $\Delta$, Hx and Hz are obtained:

$$\theta = 0 \text{ and } \phi = \frac{\pi}{2} \rightarrow \Delta_1 = F \sin\psi\cos\epsilon; Hz = 0; Hx = F$$

$$\theta = \frac{\pi}{2} \text{ and } \phi = \frac{\pi}{2} \rightarrow \Delta_2 = F \sin\epsilon; Hx = 0; Hz = F$$

$$\theta = \pi \text{ and } \phi = \frac{\pi}{2} \rightarrow \Delta_3 = -F \sin\psi\cos\epsilon; Hx = 0; Hz = -F$$

$$\theta = \frac{3\pi}{2} \text{ and } \phi = \frac{\pi}{2} \rightarrow \Delta_4 = -F \sin\epsilon; Hx = 0; Hz = -F$$

These four operations may be obtained by placing the gradient meter in the earth's field with its axis orientated in the east-west direction, which gives $\phi = \pi/2$ and $Hy = 0$. Then, by rotating the gradient meter about this axis Oy, the four desired orientations will be obtained by measuring the extinctions of the signals from two additional magnetometers placed along two axes perpendicular to Oy. When one of these magnetometers delivers a zero signal, the other delivers a signal which measures F or $-F$ depending on the case. With this signal, we can calculate:

$$\sin\psi \cos\epsilon = \frac{\Delta_1}{F} = -\frac{\Delta_3}{F}$$

$$\sin\epsilon = \frac{\Delta_2}{F} = -\frac{\Delta_4}{F}$$

As can be seen, in the case of a zero gradient, two measurements along two orthogonal orientations are sufficient.

In fact, the gradient is rarely zero and in addition an account has not been taken of the positioning error of the two additional gradient meters, corresponding in fact to the angles $\alpha$, $\beta$, $\gamma$, and $\delta$, which is in part justified by the smallness of these angles.

In the presence of a local gradient $\Delta e$, the measured value $\Delta m$ is given by $\Delta m = \Delta e + \Delta$.

When the gradient meter is rotated about its axis y, the local gradient $\Delta e$ remains constant, but $\Delta$ takes on successively the four preceding values and we can then eliminate $\Delta e$, and at the same time work out the positioning errors:

$$\frac{\Delta_e + \Delta_1 - \Delta_e - \Delta_3}{2F} = \frac{\Delta_1 - \Delta_3}{2F} = \sin\psi \cos\epsilon = k_x$$

$$\frac{\Delta_e + \Delta_2 - \Delta_e - \Delta_4}{2F} = \frac{\Delta_2 - \Delta_4}{2F} = \sin\epsilon = k_z$$

With these parameters determined, the gradient $\Delta m$ can be measured for any orientation $(\theta, \phi)$ of the gradientmeter and we can further obtain the two values $Hx_m$ and $Hz_m$ of the components of F given by the two additional magnetometers.

Taking into account the fact that $Hx_m = F \cos \theta \sin \phi$ and $Hz_m = F \sin \phi$, the value $\Delta c$ of the corrected gradient will then be given by:

$$\Delta c = \Delta m - k_x Hz_m - k_z Hz_m$$

Figure 2:
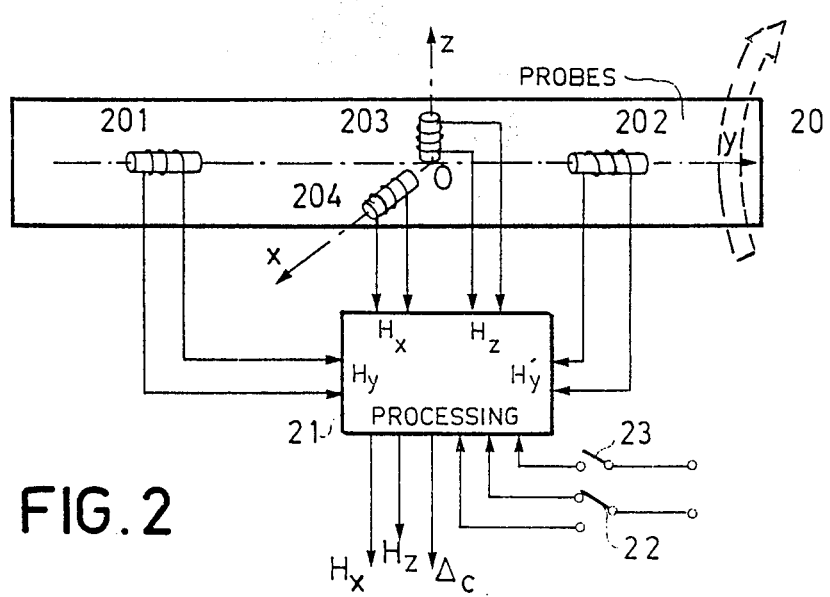
FIG. 2, the diagram of the gradient meter according to the invention.

The gradientmeter of the invention comprises then, as shown in FIG. 2, a first probe part 20 comprising two magnetometers 201 and 202 aligned along an axis oy for measuring the gradient in accordance with the known method and two magnetometers 203 and 204 disposed along two axes ox and oz perpendicular to each other and to the axis oy.

A processing part 21 comprises, electronic circuits for supplying the magnetometers with polarizing and measuring signals in the conventional way, and for obtaining the signals Hy, H'y, Hxm and Hzm processing part 21 also includes electronic circuits for calculating from these signals the value of $\Delta c$ according to the above equations, and making this value available at one output. These electronic processing circuits can also be used for calculating in a first stage the values of coefficients $k_x$ and $k_z$ during calibration. For that purpose, a switch 22 provides switching from a measuring position to a calibrating position, and in this position a push button 23 for example allows the values of Hxm and Hzm obtained in the four calibration positions to be taken into account. For that, with the axis oy of the gradient-meter orientated in an east-west direction, it is rotated about this axis oy until one of the outputs Hxm or Hzm delivers a zero signal. Then, push button 23 is pressed so as to take into account the non zero value of Hxm or Hzm. Rotation of a gradientmeter is again rotated about its axis oy and this operation is repeated three times.

It has been seen that the tolerance along the east-west orientation during calibration was very wide and could reach 30° while allowing a gradient of 1 nT to be measured in the earth's field (50000 nT).

In the case of analog circuits, the circuits contained in processing part 21 may be simplified by carrying out the calibration with separate means, for example laboratory measuring apparatus. The values of coefficients $k_x$ and $k_z$ will then be calculated manually and introduced into processing part 21, for example by adjusting potentiometers. This is justified by the fact that these coefficients are constants which do not depend on the measuring conditions and which only change very slowly because of the ageing of the probes of part 20.

Figure 3:
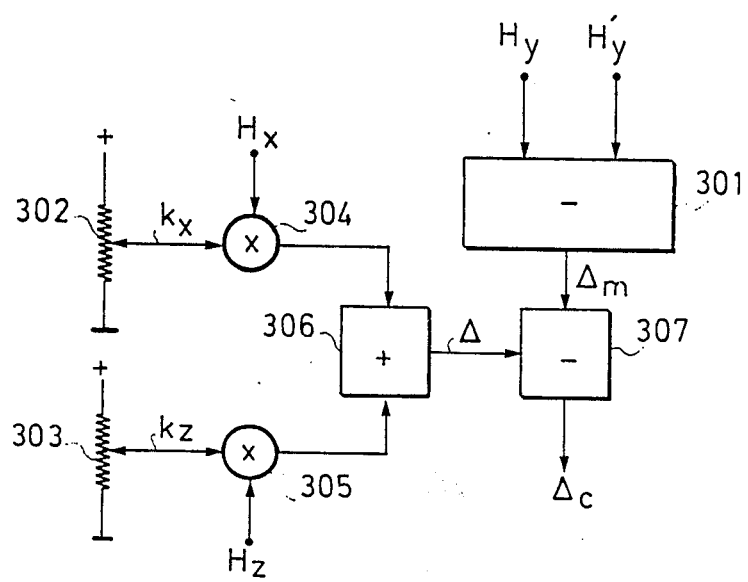
FIG. 3, the diagram of the computing means of this gradient meter.

A construction of such an analog circuit is shown in FIG. 3.

The values of Hy and H'y are applied to a subtractor 301 which delivers the measured gradient $\Delta m = Hy - H'y$.

The values of $K_x$ and $K_z$ are obtained from a +voltage source by two potentiometers 302 and 303 set as a function of the calibration.

The two terms for correcting the error are obtained by multiplying these values of the coefficients respectively by the values of Hxm and Hzm in two multipliers 304 and 305.

These two terms are added in an adder 306 which therefore delivers the correction signal $\Delta$.

This signal Δ is subtracted from Δm in a subtractor 307 which therefore delivers the corrected value Δc of the gradient.

This processing may be accomplished by means of digital circuits, formed advantageously by a suitably programmed microprocessor. It is then more advantageous to integrate the calibration means in the device since they may then be formed by a simple extension of the program of the microprocessor, which does away with a need for external means and allows the calibration to be repeated as often as required.

What is claimed is:

1. A process for the automatic compensation of mechanical errors of a magnetic gradientmeter, comprising the steps of:
   aligning a first measuring magnetometer along an axis, oy, and measuring a component, Hy, of a magnetic field F, having a given orientation along the axis oy;
   subsequently aligning a second measuring magnetometer along an axis OY, which is an axis having a slight error of alignment with the axis oy, and measuring a component H'y of the magnetic field f along the axis OY;
   subsequently substracting H'y from Hy so as to obtain a measured value Δm, of the gradient;
   aligning two additional magnetometers respectively along two axes, ox and oz, which are perpendicular to each other and perpendicular to the axis oy, and measuring two components, Hxm and Hzm, of the field F, along these two axes, ox and oz;
   orienting the axis oy of the gradient-meter in an east-west direction in the earth's magnetic field;
   rotating the gradientmeter about its axis oy and measuring components Δ1 and Δ2 of said gradient m with said two additional magnetometers, said measurements 1 and 2 being measurements for which the first and second magnetometers, respectively give a zero measurement;
   obtaining calibration coefficients as:

$$kx = \frac{\Delta 1}{F} \text{ and } kz = \frac{\Delta 2}{F};$$

using said calibration coefficients, kx and kz, to obtain two error terms kx·Hxm and kz·Hzm; and
   subtracting said two error terms from said measured value m, to obtain the corrected value of the gradient, c.

2. A process for the automatic compensation of mechanical errors of a magnetic gradientmeter, comprising the steps of:
   aligning a first measuring magnetometer along an axis oy and measuring a component Hy, of a magnetic field F, having a given orientation along the axis oy;
   subsequently aligning a second measuring magnetometer along an axis OY, which is an axis having a slight error of alignment with the axis oy, and measuring a component, H'y, of the magnetic field F, along the axis OY;
   subsequently subtracting H'y from Hy, so as to obtain a measured value Δm, of the gradient;
   aligning two additional magnetometers respectively along two axes ox and oz which are perpendicular to each other and perpendicular to the axis oy;
   rotating said gradientmeter about its axis oy, to obtain four measurements Δ1, Δ2, Δ3, and Δ4 for which respectively the first and the second, then again the first and second additional magnetometers give a zero measurement; the second and the first additional magnetomers then giving a value F, then a value −F;
   obtaining calibration coefficients as:

$$kx = \frac{\Delta 1 - \Delta 3}{2F} \text{ and } ky = \frac{\Delta 2 - \Delta 4}{2F};$$

obtaining two components, Hxm and Hzm, of the field F, along these two axes, ox and oz; using said calibration coefficients, kx and kz and said components, to obtain two error terms kx Hxm and Kz Hzm; and
   subtracting said two error terms from said measured value, m, to obtain the corrected value of the gradient, c.

* * * * *